United States Patent
Morein

(10) Patent No.: US 7,639,545 B2
(45) Date of Patent: Dec. 29, 2009

(54) MEMORY WORD LINE DRIVER FEATURING REDUCED POWER CONSUMPTION

(75) Inventor: Stephen L. Morein, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 77 days.

(21) Appl. No.: 11/865,342

(22) Filed: Oct. 1, 2007

(65) Prior Publication Data

US 2009/0086563 A1    Apr. 2, 2009

(51) Int. Cl.
    *G11C 7/00*    (2006.01)
(52) U.S. Cl. .............................. 365/189.05; 365/230.06
(58) Field of Classification Search ............. 365/189.05, 365/230.06
    See application file for complete search history.

(56) References Cited

U.S. PATENT DOCUMENTS

| | | | | |
|---|---|---|---|---|
| 4,320,507 A | * | 3/1982 | Fukushima et al. | 714/721 |
| 4,843,261 A | * | 6/1989 | Chappell et al. | 326/108 |
| 4,920,515 A | * | 4/1990 | Obata | 365/185.17 |
| 5,109,167 A | | 4/1992 | Montegari | |
| 5,198,998 A | * | 3/1993 | Kobatake | 365/185.27 |
| 6,198,686 B1 | | 3/2001 | Takita et al. | |
| 7,349,288 B1 | * | 3/2008 | Montoye et al. | 365/230.06 |
| 2002/0012284 A1 | * | 1/2002 | Mochida | 365/230.06 |
| 2007/0076512 A1 | * | 4/2007 | Castro et al. | 365/230.06 |

OTHER PUBLICATIONS

Form PCT/ISA/220, "PCT Notification of Transmittal of The International Search Report and the Written Opinion of the International Searching Authority, or the Declaration," 1 pgs., May 1, 2009.
Form PCT/ISA/210, "PCT International Search Report," 3 pgs., May 1, 2009.
Form PCT/ISA/237, "PCT Written Opinion of the International Searching Authority," 6 pgs., May 1, 2009.

* cited by examiner

*Primary Examiner*—Michael T Tran
(74) *Attorney, Agent, or Firm*—Courtney Staniford & Gregory LLP

(57) ABSTRACT

Embodiments of a random access memory word line driver circuit that reduces consumption of standby power are described. The word line driver is based on NOR-gate logic in which, for memory array consisting of a plurality of memory cells and word line drivers, given two inputs selected one word line goes high and the rest remain zero. The decoder circuit comprises two PMOS transistors in series with an NMOS-based inverter circuit. This arrangement reduces the leakage current through the NMOS transistor when the word line is not selected. An array of word line drivers incorporating a NOR-based decoder includes a shared pull up PMOS transistor for one of two address lines. The shared pull-up PMOS transistor is manufactured to a size on the order of at least two times the width of the remaining transistors of each word line stage.

13 Claims, 5 Drawing Sheets

MEMORY WORD LINE DRIVER FEATURING REDUCED POWER CONSUMPTION

FIELD

Embodiments of the invention relate generally to memory devices, and more specifically to line drivers for memory circuits that feature reduced standby and active power consumption.

BACKGROUND

Semiconductor Random Access Memory (RAM) circuits store logic states by applying either a high voltage level (such as for logic "1") or a low voltage level (such as for logic "0") to the memory cell transistors that comprise the memory array. In word line voltage control circuits, the high and low (or negative) voltage levels are applied to a selected word line in a selected sector of the memory array by a decoder circuit. Current word line drivers typically used in SRAM (static RAM) devices are NAND-style decoders that are followed by one or more stages of inverters to buffer the signal. This design is generally optimal for active power and performance, but results in high power consumption due to leakage power losses. In certain operation modes, this leakage power can dominate the active power consumption of the memory chip.

FIG. 1A illustrates a logic circuit diagram of an SRAM word line driver as known in the prior art. The word line driver 100 comprises a NAND gate 102 with address inputs A and B followed by at least one inverter circuit 104. The output is the word line (WL) selected by the A and B inputs. FIG. 1B is a transistor level diagram of a word line driver of FIG. 1B. The NAND gate portion of the driver circuit 110 comprises the transistors in circuit stage 112 and the inverter section comprises the transistors in circuit stage 114. FIG. 1B illustrates a single one-bit circuit portion for a decoder that operates on an 8-bit word, thus a common A input is provided by line 113, and individual B inputs 115, denoted $B_n$ (e.g., b1-b7) are provided to the individual NAND circuits. In the case of eight B inputs, the b0-b7 inputs would represent half of the partially decoded word lines. For a 64-word line circuit, there would be eight different A inputs and eight different B inputs. To select word line 0 (WL0=1), the decoder would select $A_0B_0$, and to select word line 63, the decoder would select $A_7B_7$.

A typical SRAM circuit may have 128 or more word lines. During normal operation, only one word line is in use and the remaining lines are inactive. FIG. 1C illustrates a word line driver comprising a plurality of NAND gate driver circuits of FIG. 1B. FIG. 1C illustrates a single eight-bit portion of a decoder circuit for a single A input and eight B (b0-b7) inputs. For the circuit of FIG. 1C, only one word line output is active when a valid address is selected for the memory block controlled by decoder circuit 120. The active word line (WLn1) is consuming active power, and the remaining inactive word lines are all consuming standby power. In a typical NAND gate based decoder circuit, the standby power may be three times the active power. This is significant power consumption when one word line is selected, however, in the case when the memory is not active every clock cycle, the proportion of standby power consumed to active power becomes even more significant.

The source of such high leakage power is described in relation to the transistor circuit illustrated in FIG. 1B. In such a circuit, generally it is the inverter stage 114 that causes a majority of the standby power consumption. The inverter stage 114 consists of a PMOS (p-channel metal-oxide semiconductor) transistor 116 and an NMOS (n-channel metal-oxide semiconductor) transistor 118. In order to maintain a certain performance characteristic, the PMOS transistor 116 is typically a relatively large transistor to provide adequate output power characteristics.

When a word line for a particular NAND circuit is selected, the word line (WL) output 120 is logic high. In this case, the gate of PMOS transistor 116 is at logic 0 (ground) and the gate of NMOS transistor 118 is at ground. The leakage current of the inverter circuit consists of leakage through the NMOS transistor 118, IL-NMOS, and this is relatively minimal at least in part because the NMOS transistor 118 is smaller than the PMOS transistor 116. The worst case leakage current scenario occurs when the word line for the NAND circuit is deselected, and the WL output is logic 0. In this case, the gate of PMOS transistor 116 is at logic 1 ($V_{dd}$) and the gate of NMOS transistor 118 is at logic 1 ($V_{dd}$). The leakage current in this case consists of the leakage through the PMOS transistor 116, $I_{L\text{-}NMOS}$, which is generally significantly larger than IL-NMOS. With respect to the entire word line driver circuit, the critical path for the active state is when the NAND stage transistors 112 are pulled down, and the PMOS transistor 116 of the inverter circuit is pulled up. This results in the maximum leakage current through the word line driver.

The worst case leakage current scenario is when either none or only one word line is selected. In this case, a maximum amount of leakage power is consumed thus accounting for the significant consumption of standby power for NAND-gate based word line drivers.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

Embodiments of a random access memory word line driver circuit that reduces overall power consumption are described. The word line driver for a memory array consisting of a plurality of memory cells and word line drivers is based on NOR-gate logic in which, given two inputs selected, one word line goes high and the rest remain zero. The decoder circuit comprises two PMOS transistors in series with an NMOS-based inverter circuit. This arrangement reduces the leakage current through the NMOS transistor when the word line is not selected. An array of word line drivers incorporating a NOR-based decoder includes a shared pull up PMOS transistor for one of two address lines. The shared pull-up PMOS transistor is manufactured to a size on the order of at least two times the size of the remaining transistors of each word line stage.

In the following description, numerous specific details are introduced to provide a thorough understanding of, and enabling description for, embodiments of the word line driver. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

Figure 1A:
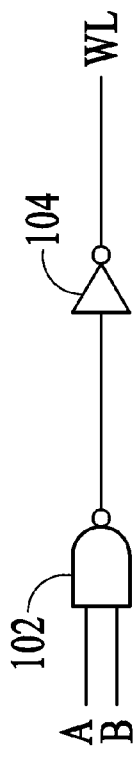
FIG. 1A illustrates a logic circuit diagram of an NAND gate word line driver as known in the prior art.
Figure 1B:
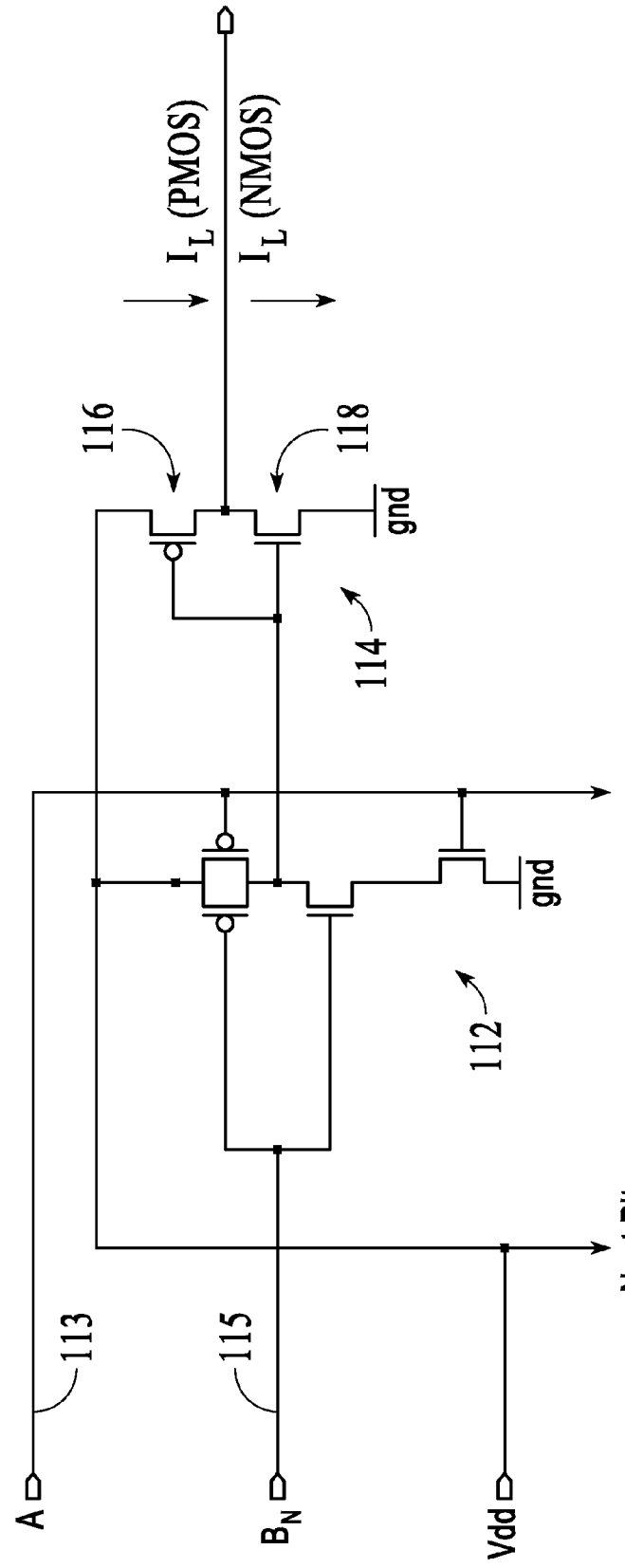
FIG. 1B is a transistor level diagram of NAND gate word line driver of FIG. 1B.
Figure 1C:
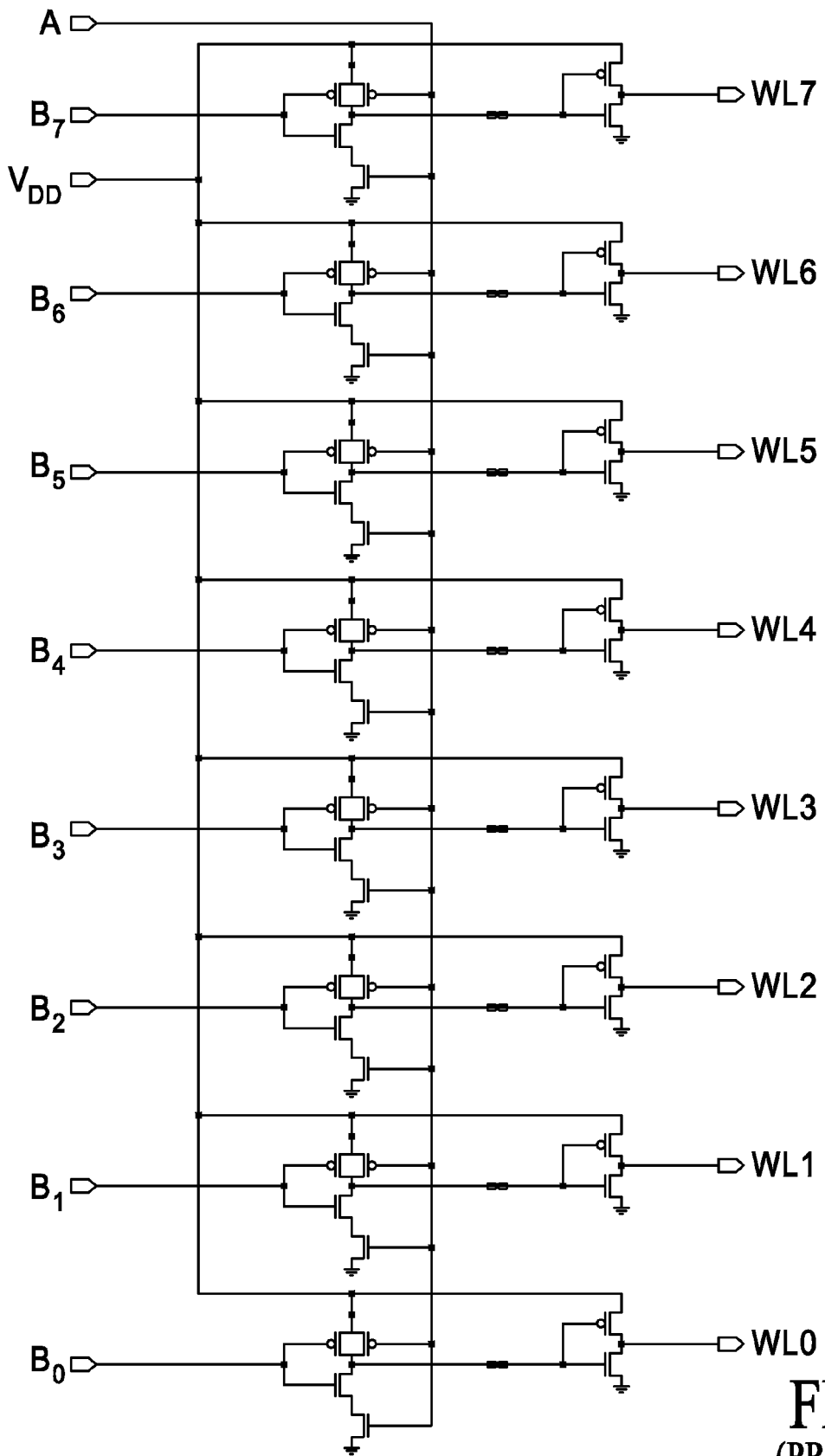
FIG. 1C illustrates a known word line driver comprising a plurality of NAND gate driver circuits of FIG. 1B.
Figure 2:
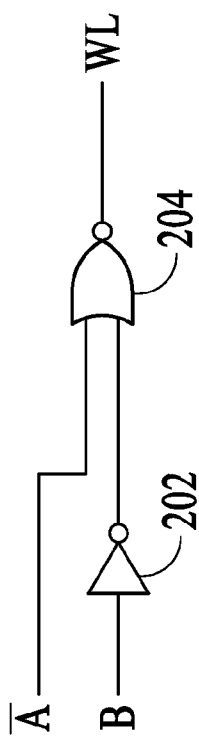
FIG. 2 is a logic circuit diagram of a NOR-based word line driver under an embodiment.

In embodiment, a memory word line driver (decoder circuit) comprises two PMOS transistors in series with an NMOS-based inverter circuit. This arrangement generally reduces the leakage current through the NMOS transistor when the word line is not selected in comparison with traditional NAND-based decoder circuits, such as the circuit illustrated in FIG. 1B. FIG. 2 is a logic circuit diagram of a NOR-based word line driver under an embodiment. Circuit 200 comprises an inverter coupled in series to a NOR gate 204. The address line inputs A and B are configured such that inverter 202 receives the B input, which is passed as one input to the NOR gate 204, while an inverted value of A comprises the second input to the NOR gate 204. The state of the word line (WL) output from NOR gate 204 represents whether the address AnBn input to circuit 200 is selected or deselected for a memory read or write operation. The use of a NOR circuit allows the sharing of one or more transistors among parallel connected circuits, such as is used in a memory array address decoder driver.

Figure 3:
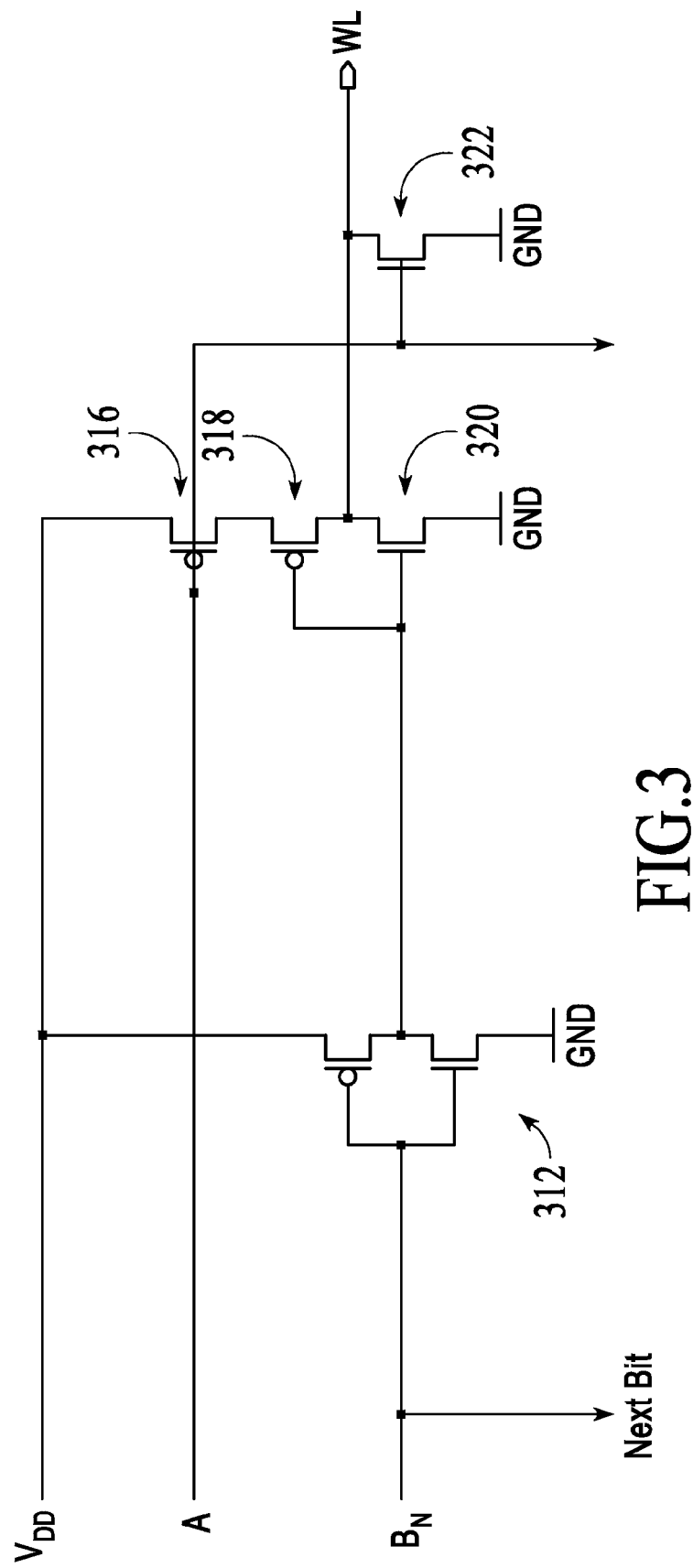
FIG. 3 is a transistor level diagram of a word line driver of FIG. 2, under an embodiment.

FIG. 3 is a transistor level diagram of a word line driver of FIG. 2, under an embodiment. As shown in circuit 300, an inverter stage 312 comprising transistors 302 and 304 takes the $B_n$ input for the address and provides some degree of driving power for this signal, while the NOR stage 314 comprising transistors 316-322 accepts the A input for the address. In the case where an address processed through circuit 300 is deselected (WL=0), the A input is logic 0 and/or the B input to the circuit is logic 0. For an example in which case the A address is deselected, the A inverse input would be logic 1, and the B input may be a logic 1 as well. In this case, the input to transistors 318 and 320 would be logic 0. In this state, the output transistor 322 would be on. In one embodiment, device 322 at the output of the NOR stage is a relatively small and weak device, with a transistor width of 0.25 microns, versus 5 microns for the other transistors, for example. This allows the output of the NOR stage 314 to be held on corresponding output for the WL line at a logic 0 state. The output transistor 322 aids in guarding against noise effects and any timing effects. In this configuration, in which the WL output is deselected, the transistors 318 and 320 of the NOR stage 314 are effectively reverse-biased, as their source voltage is greater than their gate voltage. In this state, the leakage current $I_L$ is minimized, and thus the power consumption of the circuit when the WL output is deselected is comparatively lower than that of a NAND-based circuit, such as shown in FIG. 1B.

In the case in which the decoder circuit 300 selects a particular memory block, the A input is 0 and the B input remains 1. In this case, transistor 318 is at a logic 1 state and transistor 322 is at a logic 0 state. The output of these two transistors for the WL output is thus at a logic 1. The critical path for activation of a word line for circuit 300 comprises the inverter stage 312 being pulled down and both transistors 316 and 318 of the NOR stage 314 being pulled up.

Figure 4:
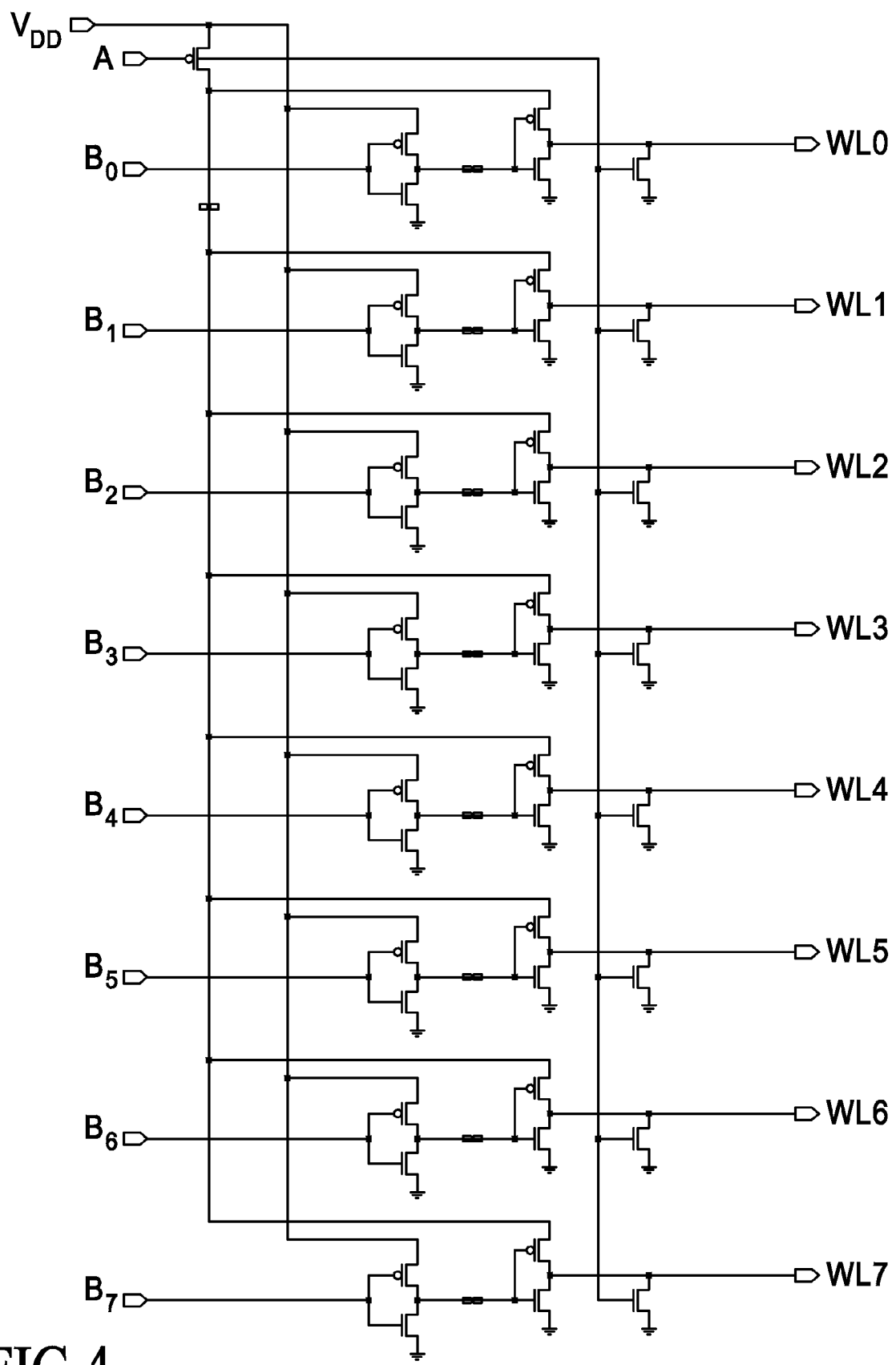
FIG. 4 illustrates a word line driver comprising a plurality of NOR gate driver circuits, under an embodiment.

In one embodiment, a word line driver incorporating the NOR-based WL drivers comprises a number of circuits 300 coupled in parallel. For this embodiment, transistor 316 which receives the A address input is shared among multiple sections. FIG. 4 illustrates a word line driver comprising a plurality of NOR-gate driver circuits, under an embodiment. As shown in circuit 400, bit address lines B0-B7 are each input to separate NOR-based word driver circuits 402-416, while a single common PMOS transistor 418 is provided for the A address line. The $A_n$ address line represents one line out of eight for a 64 byte memory array (n=0 to 7). The circuit of FIG. 3 features a shared PMOS stage based on transistors 316 and 318. To maintain the same performance level as a single PMOS pull up, either both devices must be twice the size, or they must be asymmetrically sized so that the logical rule: $G_{tot}=1/(s*(1-s)+2y)/(1+y)$ is satisfied. The above equation represents a starting point for the calculation of the relative transistor widths, and the calculation may take into account other factors, such as physical effects. In general, the width of the transistors can be varied until the desired performance characteristics are obtained.

To overcome this constraint, as shown in FIG. 4, the eight pull up transistors 316 are merged into a single shared device represented as transistor 418 of FIG. 4. In one embodiment, the size (width) of transistor 418 is significantly larger than that of remaining transistors in the circuit to maintain the required drive characteristics. For example, if the average width of the transistors in circuit 300 is on the order of 5 microns, except for transistor 322, which is on the order of 0.25 microns wide, the pull up transistor 316 (or 418 in FIG. 4) would be on the order of 12 microns wide. This results in a word line driver that has no increased active power consumption, but the same performance. In a moderate leakage situation at moderately high temperatures, the total power consumed by circuit 400 in comparison to current known circuits, such as circuit 120 is the same, but the standby power is significantly reduced.

Although circuit 400 may consume more active power in certain circumstances, due to the upsizing of particular transistors in the circuit, the savings of standby power outweighs the increased consumption of active power for an improved power budget. Because leakage power is exponential with temperature of the chip, it is generally only in the case of an unnaturally cooled circuit will the savings of standby power possibly not outweigh the increased active power consumption. For normal usage, for example, a chip operating at room temperature and above, and certainly in the case of a chip running at elevated temperatures, embodiments of the word line driver described herein provide potentially significant savings in overall power consumption.

In one embodiment, the word line driver circuit can be used with any appropriate type of RAM array, including SRAM and DRAM (dynamic RAM) memories. Such memory circuits can be used in or integrated in any type of processor, co-processor, arithmetic logic units, or other processing units; and such a processing unit can be a Graphics Processing Unit (GPU), or Visual Processing Unit (VPU), which is a dedicated graphics rendering device for a personal computer, workstation, or game console.

Figure 5:
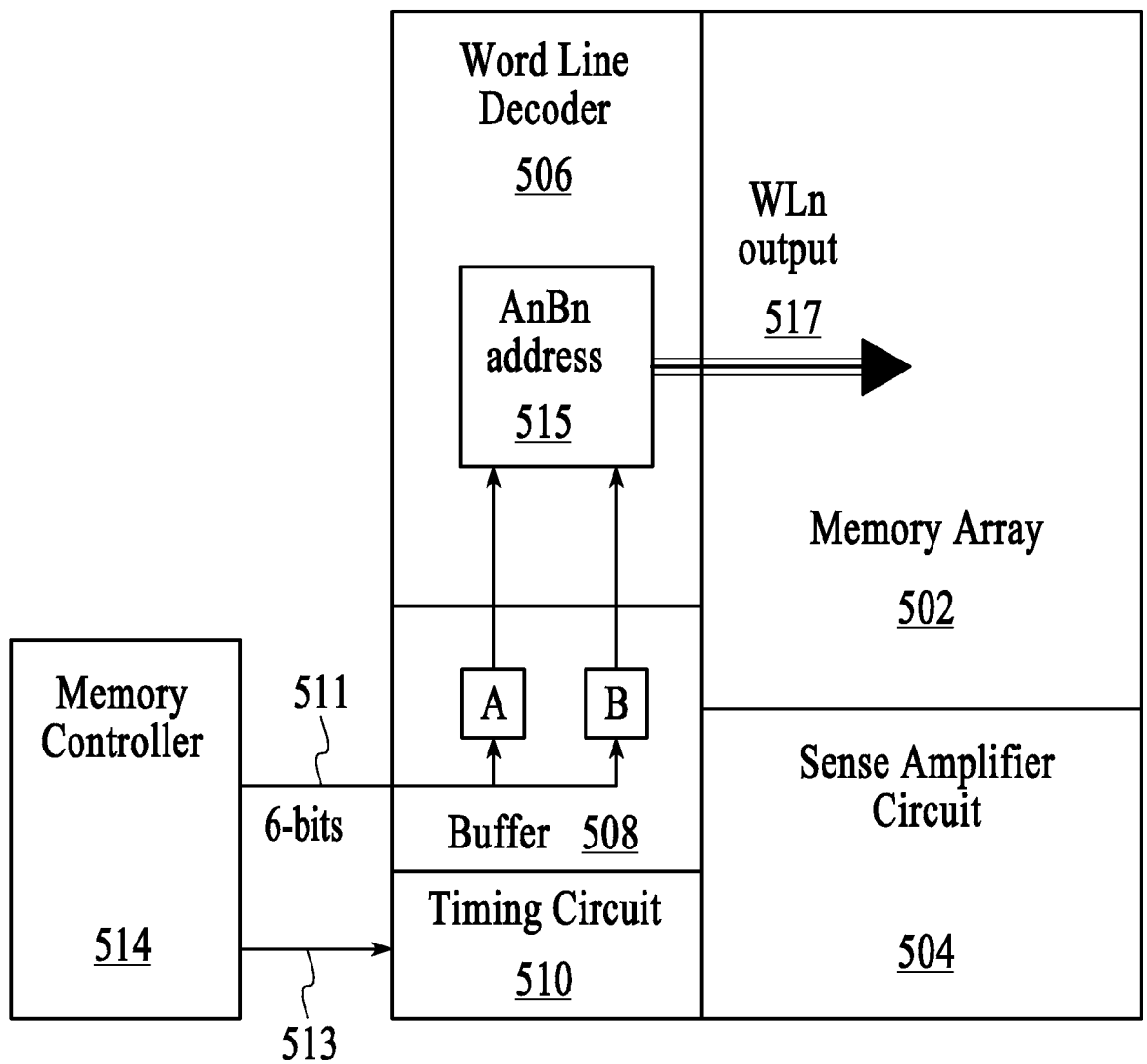
FIG. 5 illustrates a memory array circuit that incorporates a word line driver in accordance with embodiments.

FIG. 5 illustrates a memory array circuit that incorporates a word line driver in accordance with embodiments. In a typical memory addressing system, the word lines are arranged corresponding to the rows of memory cells, and bit line pairs are arranged corresponding to the columns of memory cells. For the system illustrated in FIG. 5, a memory controller 514 outputs certain address signals over line 511 and memory access or timing signals over line 513 to a memory array and control block 500. System 500 includes an SRAM memory array 502 that consists of a number of addressable memory cells. The content of the memory cells are output through a sense amplifier circuit 504 which amplifies the voltage level of the bit lines during a read operation. The address lines 511 from the memory controller 514 are passed through a buffer circuit 508 to word line decoder 506. The word line decoder consists of a number of NOR-gate based circuits, such as illustrated in FIG. 4, which take the $A_nB_n$ addresses provided over line 511 and output a corresponding specific word line output 517 ($WL_n$) to access a memory location within memory array 502 during a read or write operation.

For the embodiment of FIG. 5, the memory controller 514 provides a six-bit address over line 511. This six-bit address is divided into a three-bit A component and a 3-bit B component within buffer circuit 508. The word line decoder 506 decodes the six-bit $A_nB_n$ address 515 into a 64-bit word line output 517 ($WL_{0-63}$). For this embodiment, the word line decoder 506 includes the NOR-based word line driver circuit illustrated in FIGS. 3 and 4.

The sense amplifier circuit 504 is arranged corresponding to bit line pairs (not shown). During standby the bit line pairs are pre-charged to an intermediate voltage level and data of the memory cell is read onto one of the paired bit lines in an active cycle. The sense amplifier circuit 504 differentially amplifies and latches the voltage levels on corresponding bit line pairs.

In one embodiment, the word line decoder circuit may be used in conjunction with a self-time restore circuit.

In one embodiment, a method of addressing memory cells using a memory word line driver according to embodiments may be performed by a computer program implemented as either software or firmware and executed by a processor coupled to the word line driver. The program may be written in a hardware description language (HDL) that comprises a formal description of the circuit or circuits of the memory word line driver. Such a language describes the circuit's operation, design and organization, and can include tests to verify operation through simulation. Alternatively, the program may be written in a high level language or any other appropriate language to access memory locations controlled by the memory word line driver.

Although embodiments are described in relation to memory devices that are provided in a particular component type, e.g., metal-oxide semiconductor field-effect transistor ("MOSFET") technologies like complementary metal-oxide semiconductor ("CMOS"), alternative embodiments may be implemented for other bipolar technologies like emitter-coupled logic ("ECL"), polymer technologies (e.g., silicon-conjugated polymer and metal-conjugated polymer-metal structures), mixed analog and digital, and so on.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the word line driver circuitry is not intended to be exhaustive or to limit the embodiments to the precise form or instructions disclosed. While specific embodiments of, and examples for, processes in graphic processing units or ASICs are described herein for illustrative purposes, various equivalent modifications are possible within the scope of the disclosed methods and structures, as those skilled in the relevant art will recognize.

The elements and acts of the various embodiments described above can be combined to provide further embodiments. These and other changes can be made to the described circuit in light of the above detailed description.

In general, in the following claims, the terms used should not be construed to limit the disclosed method to the specific embodiments disclosed in the specification and the claims, but should be construed to include all operations or processes that operate under the claims. Accordingly, the disclosed structures and methods are not limited by the disclosure, but instead the scope of the recited method is to be determined entirely by the claims.

While certain aspects of the disclosed embodiments are presented below in certain claim forms, the inventors contemplate that various aspects of the methodology in any number of claim forms. Accordingly, the inventors reserve the right to add additional claims after filing the application to pursue such additional claim forms for other aspects.

What is claimed is:

1. A circuit comprising:
a first PMOS transistor accepting a first address line;
an inverter circuit accepting a second address line that transmits a single bit of an eight-bit word;
a pull-up circuit coupled in series to the PMOS transistor and to an output of the inverter circuit, and comprising a second PMOS circuit coupled in series to a first NMOS transistor, the pull-up circuit providing a word line output corresponding to an address provided over the first address line and a second address line, wherein the pull-up circuit is configured to be in a reverse-biased condition when the word line output is in a deselected state, and further wherein the first PMOS transistor is coupled to a plurality of additional word line decoder stages, each decoder stage of the additional decoder stages configured to transmit respective single bit portions of the eight bit word.

2. The circuit of claim 1 wherein the inverter comprises a third PMOS transistor coupled in series to a second NMOS transistor.

3. The circuit of claim 1 wherein the first PMOS transistor is manufactured to a scale exceeding at least twice the width of the second PMOS transistor, third PMOS transistor, first NMOS transistor and second NMOS transistor.

4. A word line address decoder comprising:
a first PMOS transistor receiving a first bit of a first decoded portion of an Address; and
a plurality of transistor stages coupled to the first PMOS transistor, each transistor stage receiving a respective second bit of a second decoded portion of the address and providing a word line output enabling or disabling a corresponding word line based on a logic state of the first bit and second bit, each transistor stage including a pull-up circuit configured to operate in a reverse biased mode when the corresponding word line is in a deselected logic state, wherein the first PMOS transistor comprises part of the pull-up circuit of each transistor stage.

5. The word line address decoder of claim 4 wherein the first PMOS transistor is manufactured to a scale exceeding at least twice the width of the second PMOS transistor and the NMOS transistor of each transistor stage.

6. The word line address decoder of claim 5 wherein the word line output of each transistor stage is input to a memory array comprising a plurality of addressable memory cells.

7. The word line address decoder of claim 4 wherein the first decoded portion comprises three bits and the second decoded portion comprises three bits.

8. The word line address decoder of claim 7 wherein the memory array comprises a static random access memory array.

9. A memory addressing system comprising:
   a memory array having multiple rows of memory cells;
   a buffer circuit receiving a first portion of an address and a second portion of the address;
   a word line decoder circuit receiving the first and second portions of the address and providing a word line output enabling or disabling a corresponding word line selecting a cell within the memory array based on a logic state of a first bit of the first portion and a second bit of the second portion, wherein the word line decoder circuit includes a first PMOS transistor receiving the first bit, and coupled to a plurality of transistor stages, each receiving a bit of the second address portion and having a pull-up circuit configured to operate in a reverse biased mode when the corresponding word line is in a deselected logic state, wherein the first PMOS transistor comprises part of the pull-up circuit of each transistor stage, and further wherein the first PMOS transistor is manufactured to a scale exceeding at least twice the width of the second PMOS transistor and the NMOS transistor of each transistor stage.

10. The memory addressing system of claim 9 wherein the memory array comprises a static random access memory array.

11. The memory addressing system of claim 9 wherein the word line decoder circuit constitutes a logical NOR gate based circuit in which the first bit is input into a first input of the NOR gate and the second bit is input into an inverter coupled to a second input of the NOR gate.

12. A machine-readable medium having a plurality of instructions stored thereon that, when executed by a processor coupled to a memory word line driver in a system, performs the operations of:
   receiving a first bit of a first decoded portion of an address in a first PMOS transistor; and
   receiving a respective second bit of a second decoded portion of the address in a plurality of transistor stages coupled to the first PMOS transistor, each transistor stage and providing a word line output enabling or disabling a corresponding word line based on a logic state of the first bit and second bit, each transistor stage including a pull-up circuit configured to operate in a reverse biased mode when the corresponding word line is in a deselected logic state, wherein the first PMOS transistor comprises part of the pull-up circuit of each transistor stage, and wherein the word line output of each transistor stage is input to a memory array comprising a plurality of addressable memory cells, and further wherein the first decoded portion comprises three bits and the second decoded portion comprises three bits.

13. The machine-readable medium of claim 12 wherein the instructions are written in a Hardware Description Language (HDL).

* * * * *